United States Patent
Sawada

(10) Patent No.: US 11,050,952 B2
(45) Date of Patent: Jun. 29, 2021

(54) READING CIRCUIT FOR INFRARED DETECTORS AND METHOD FOR INSPECTING SAME

(71) Applicant: FUJITSU LIMITED, Kawasaki (JP)

(72) Inventor: Akira Sawada, Fujisawa (JP)

(73) Assignee: FUJITSU LIMITED, Kawasaki (JP)

( * ) Notice: Subject to any disclaimer, the term of this patent is extended or adjusted under 35 U.S.C. 154(b) by 46 days.

(21) Appl. No.: 16/599,594

(22) Filed: Oct. 11, 2019

(65) Prior Publication Data

US 2020/0137323 A1    Apr. 30, 2020

(30) Foreign Application Priority Data

Oct. 26, 2018   (JP) .............................. JP2018-202207

(51) Int. Cl.
*H01L 25/00* (2006.01)
*H04N 5/33* (2006.01)
*H01L 27/146* (2006.01)

(52) U.S. Cl.
CPC ......... *H04N 5/33* (2013.01); *H01L 27/14607* (2013.01); *H01L 27/14612* (2013.01); *H01L 27/14669* (2013.01)

(58) Field of Classification Search
CPC .... H04N 5/33; H04N 5/3741; H04N 5/37452; H01L 27/14607; H01L 27/14612; H01L 27/14669; H01L 27/1467
See application file for complete search history.

(56) References Cited

U.S. PATENT DOCUMENTS

| | | | |
|---|---|---|---|
| 6,249,002 B1 * | 6/2001 | Butler | G01J 5/22 250/338.4 |
| 6,791,610 B1 * | 9/2004 | Butler | H04N 5/3651 348/297 |
| 2014/0151532 A1 * | 6/2014 | Ito | H04N 5/37452 250/208.1 |
| 2017/0085823 A1 | 3/2017 | Kizuna | |
| 2019/0297287 A1 * | 9/2019 | Oka | H04N 5/369 |

FOREIGN PATENT DOCUMENTS

| | | |
|---|---|---|
| JP | 2009-77173 | 4/2009 |
| JP | 2017-60071 | 3/2017 |
| JP | 2017-163475 | 9/2017 |

* cited by examiner

*Primary Examiner* — Kiho Kim
(74) *Attorney, Agent, or Firm* — Fujitsu Patent Center

(57) ABSTRACT

A reading circuit for an infrared detector, includes: pixel driving circuits arranged in a matrix; vertical selection lines provided for respective rows of the pixel driving circuits; horizontal selection lines provided for respective columns of the pixel driving circuits; a vertical selection circuit configured to output a row selection signal to the vertical selection lines; and a horizontal selection circuit configured to output a column selection signal to the horizontal selection lines to read, to a reading line, a signal from pixel driving circuits for one row selected by the row selection signal, wherein each pixel driving circuit includes a driving circuit of the infrared detector, and a switching circuit configured to switch whether or not to input a test signal to the driving circuit, based on the row selection signal output to a corresponding vertical selection line and the column selection signal output to a corresponding horizontal selection line.

14 Claims, 18 Drawing Sheets

READING CIRCUIT FOR INFRARED DETECTORS AND METHOD FOR INSPECTING SAME

CROSS-REFERENCE TO RELATED APPLICATION

This application is based upon and claims the benefit of priority of the prior Japanese Patent Application No. 2018-202207, filed on Oct. 26, 2018, the entire contents of which are incorporated herein by reference.

FIELD

The embodiment discussed herein is related to a reading circuit for infrared detectors and a method for inspecting the same.

BACKGROUND

A solid-state imaging device is inspected.
Related art is disclosed in Japanese Laid-open Patent Publication No. 2009-77173.

SUMMARY

According to an aspect of the embodiment, a reading circuit for an infrared detector, includes: a plurality of pixel driving circuits arranged in a matrix shape; a plurality of vertical selection lines provided for respective rows of the plurality of pixel driving circuits; a plurality of horizontal selection lines provided for respective columns of the plurality of pixel driving circuits; a vertical selection circuit configured to sequentially output a row selection signal to the plurality of vertical selection lines; and a horizontal selection circuit configured to sequentially output a column selection signal to the plurality of horizontal selection lines to sequentially read, to a reading line, a signal from pixel driving circuits for one row which are selected by the row selection signal among the plurality of pixel driving circuits, wherein each of the plurality of pixel driving circuits includes a driving circuit of the infrared detector, and a switching circuit configured to switch whether or not to input a test signal supplied from outside to the driving circuit, based on the row selection signal output to a corresponding vertical selection line among the plurality of vertical selection lines and the column selection signal output to a corresponding horizontal selection line among the plurality of horizontal selection lines.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT

For example, in a solid-state imaging device and a method for inspecting the same, an operation of a signal processing unit is checked without actually performing imaging and checking of the operation is easily realized with desired data. For example, a solid-state imaging device includes pixels arranged in a matrix shape, vertical signal lines wired to respective columns of the pixels, holding units which are coupled to the respective vertical signal lines and hold electric signals read from the corresponding pixels, and a horizontal scanning unit which supplies a selection signal for sequentially selecting the holding units.

This solid-state imaging device includes the horizontal scanning unit capable of supplying a predetermined data signal to each of the holding units, and a signal processing unit which outputs an electric signal read from the holding unit selected by the horizontal scanning unit. Such a configuration enables a data signal to be input from the horizontal scanning unit to each of the holding units without performing imaging with the pixels arranged in a matrix shape. Therefore, the operation of the signal processing unit may be checked without actually performing imaging with the pixels arranged in a matrix shape.

For example, a plurality of pixel driving circuits arranged in a matrix shape are not used and a data signal is input to a circuit at a subsequent stage of the plurality of pixel driving circuits so as to perform an inspection. Therefore, the plurality of pixel driving circuits, arranged in a matrix shape and each including a circuit for driving an infrared detector, may not be individually inspected.

Accordingly, the present disclosure provides a reading circuit for infrared detectors, the reading circuit having a configuration that enables a plurality of pixel driving circuits, arranged in a matrix shape and each including a circuit for driving an infrared detector, to be individually inspected. The present disclosure also provides an inspection method of a reading circuit for infrared detectors, the inspection method enabling a plurality of pixel driving circuits, arranged in a matrix shape and each including the circuit for driving an infrared detector, to be individually inspected.

Hereinafter, an embodiment according to the present disclosure is described.

Figure 1:
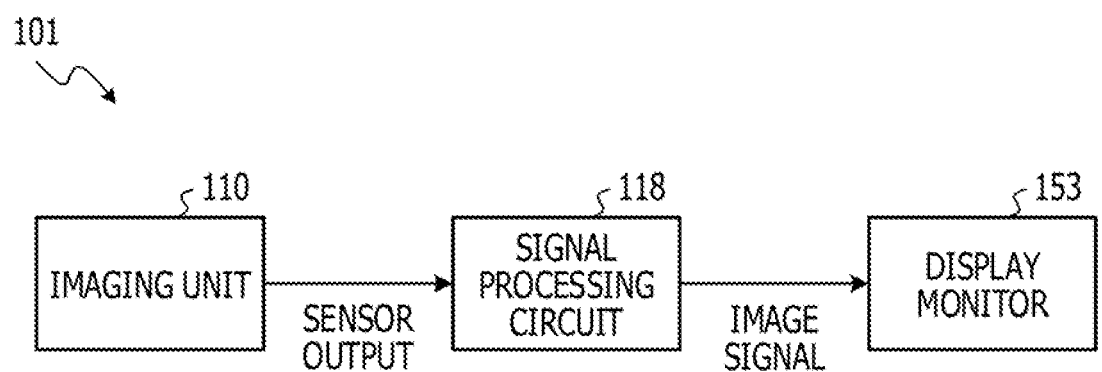
FIG. 1 is a diagram illustrating an example of a configuration of an infrared imaging apparatus.

FIG. 1 is a diagram illustrating an example of a configuration of an infrared imaging apparatus according to the present embodiment. An infrared imaging apparatus 101 illustrated in FIG. 1 includes an imaging unit 110, a signal processing circuit 118, and a display monitor 153. The display monitor 153 may be included in or may not be included in a configuration of the infrared imaging apparatus 101.

The imaging unit 110 includes an imaging device. The imaging device is also referred to as an image sensor. The imaging unit 110 converts an analog sensor output signal (a pixel output signal) output from the imaging device into a digital sensor output signal (an infrared imaging signal), and outputs the digital sensor output signal. The signal processing circuit 118 generates an image signal for generating a thermal image to be displayed on the display monitor 153, based on the digital infrared imaging signal output from the imaging unit 110. The display monitor 153 displays the thermal image, based on the image signal output from the signal processing circuit 118.

Figure 2:
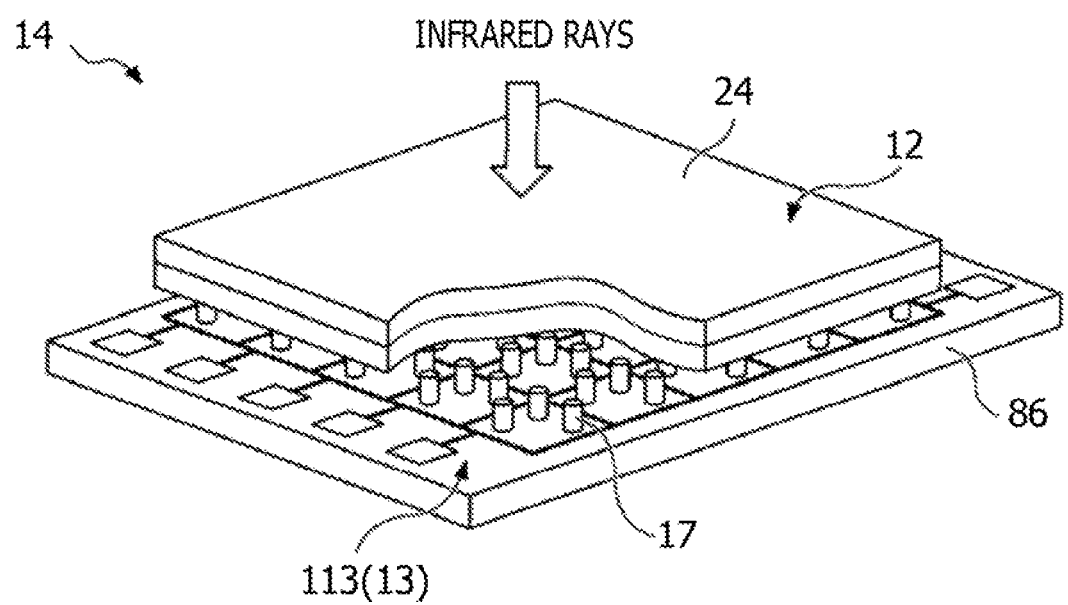
FIG. 2 is a diagram illustrating an example of a configuration of an imaging device.

FIG. 2 is a diagram illustrating an example of a configuration of an imaging device. In an imaging device 14 illustrated in FIG. 2, a plurality of infrared detectors 24 arranged in a two-dimensional array detect infrared rays emitted from an object to be observed in accordance with a surface temperature of the object to be observed. The imaging device 14 outputs, from a reading circuit 113, an analog sensor output signal (a pixel output signal) for generating a thermal image indicating a surface temperature distribution of the object to be observed.

The imaging device 14 includes a sensor array 12 in which the plurality of infrared detectors 24 are arranged in a matrix shape, and a circuit substrate 86 on which the reading circuit 113 which reads an electric signal obtained in the sensor array 12 is formed. The reading circuit 113 reads an electric signal according to an intensity of infrared rays incident on each of the plurality of infrared detectors 24, and outputs the electric signal as a sensor output signal to the outside of the imaging device 14 in time series. The sensor array 12 and the reading circuit 113 are coupled to each other by a plurality of bumps 17 made of indium, for example.

Next, an example of a configuration of a reading circuit 13 according to a comparative example is described in order to compare the reading circuit 13 with the reading circuit 113 in the present embodiment.

Figure 3:
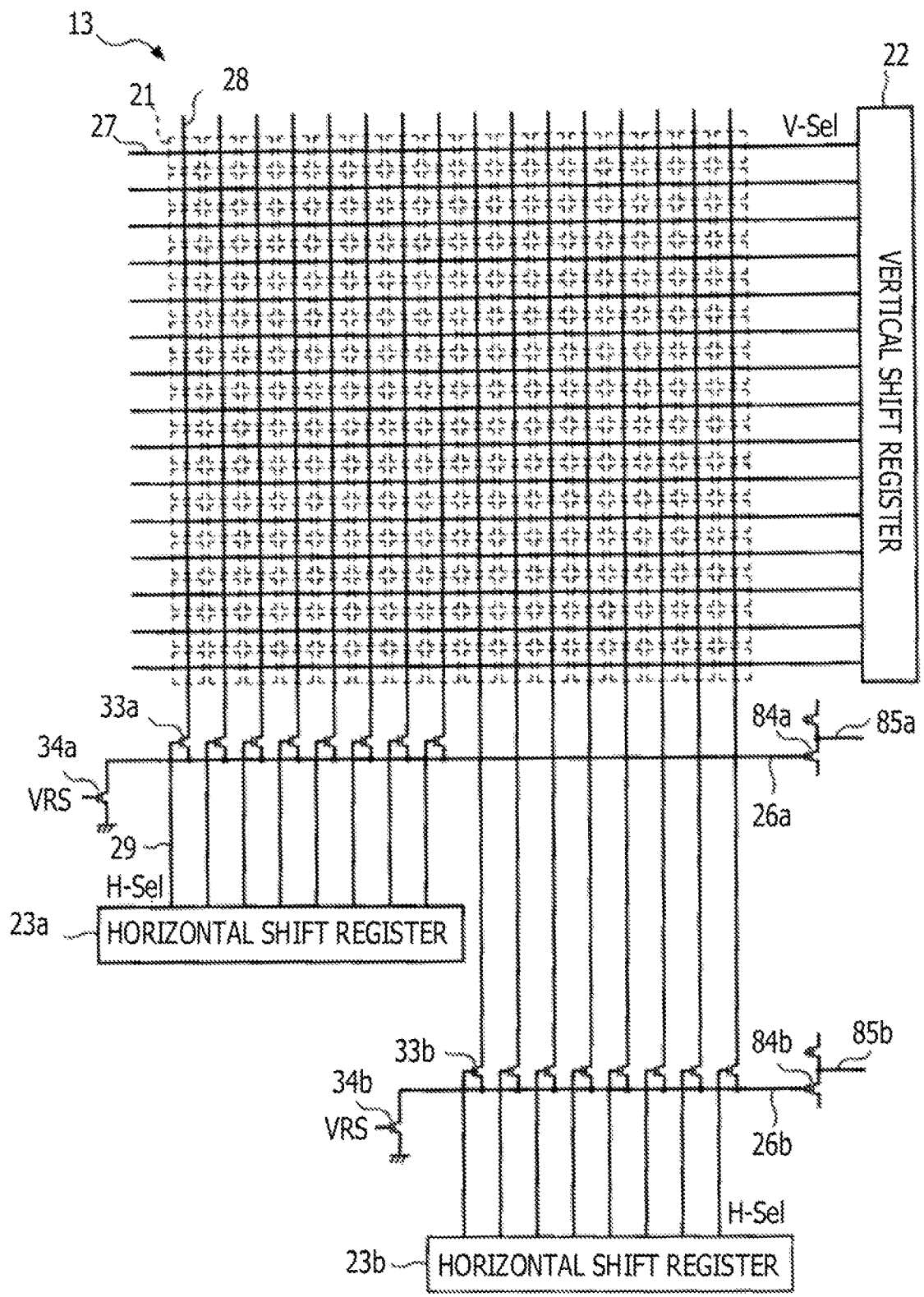
FIG. 3 is a diagram illustrating an example of a configuration of a reading circuit according to a comparative example.

FIG. 3 is a diagram illustrating an example of the configuration of the reading circuit 13 in the comparative example. The reading circuit 13 includes a plurality of pixel driving circuits 21, a plurality of vertical buses 28, a plurality of vertical selection lines 27, a plurality of horizontal selection lines 29, a vertical shift register 22, and horizontal shift registers 23 (23a and 23b). The reading circuit 13 also includes reading lines 26 (26a and 26b), column selection transistors 33 (33a and 33b), bias transistors 34 (34a and 34b), and output amplifiers 84 (84a and 84b).

Each of the plurality of pixel driving circuits 21 drives a corresponding infrared detector among a plurality of infrared detectors, and generates, for each frame, a signal according to infrared rays incident on the corresponding infrared detector. The plurality of pixel driving circuits 21 are arranged in a matrix shape to correspond to respective intersections of the plurality of vertical selection lines 27 and the plurality of vertical buses 28. Each of the plurality of pixel driving circuits 21 is provided for a corresponding one of the plurality of infrared detectors. The plurality of pixel driving circuits 21 have configurations that are identical to one another.

The plurality of vertical buses 28 are vertical reading lines provided for respective columns of the plurality of pixel driving circuits 21, and extend in parallel to a vertical direction (a column direction).

The plurality of vertical selection lines 27 are scan lines provided for respective rows of the plurality of pixel driving circuits 21, and extend in parallel to a horizontal direction (a row direction).

The plurality of horizontal selection lines 29 are scan lines provided for respective columns of the plurality of pixel driving circuits 21.

The vertical shift register 22 is an example of a vertical selection circuit which sequentially outputs a row selection signal V-Sel to the plurality of vertical selection lines 27. The row selection signal V-Sel is also referred to as a scan pulse.

Each of the horizontal shift registers 23 (23a and 23b) is an example of a horizontal selection circuit which sequentially outputs a column selection signal H-Sel to the plurality of horizontal selection lines 29. The column selection signal H-Sel is also referred to as a read pulse. A first horizontal shift register 23a sequentially outputs the column selection signal H-Sel to the plurality of horizontal selection lines 29 so as to sequentially read signals from the pixel driving circuits 21 for one row selected by the row selection signal V-Sel to a first reading line 26a. A second horizontal shift register 23b sequentially outputs the column selection signal H-Sel to the plurality of horizontal selection lines 29 so as to sequentially read signals from the pixel driving circuits 21 for one row selected by the row selection signal V-Sel to a second reading line 26b.

A gate of each of the plurality of column selection transistors 33 (33a and 33b) is coupled to the corresponding horizontal selection line 29 among the plurality of horizontal selection lines 29. A gate of each of the plurality of first column selection transistors 33a is coupled to the first horizontal shift register 23a via the corresponding horizontal selection line 29 among the plurality of horizontal selection lines 29. A gate of each of the plurality of second column selection transistors 33b is coupled to the second horizontal shift register 23b via the corresponding horizontal selection line 29 among the plurality of horizontal selection lines 29.

A first bias transistor 34a is coupled between the first reading line 26a and ground. A voltage VRS is supplied from a power supply to a gate of the first bias transistor 34a. The first bias transistor 34a is used as a constant current circuit which supplies a bias current to an amplification transistor 31 and a row selection transistor 32, to be described below, in each of the pixel driving circuits 21, and to the first column selection transistors 33a.

The second bias transistor 34b is coupled between the second reading line 26b and the ground. The voltage VRS is supplied from a power supply to a gate of the second bias transistor 34b. The second bias transistor 34b is used as a constant current circuit which supplies a bias current to the amplification transistor 31 and the row selection transistor 32, to be described below, in each of the pixel driving circuits 21, and to the second column selection transistors 33b.

Figure 4:
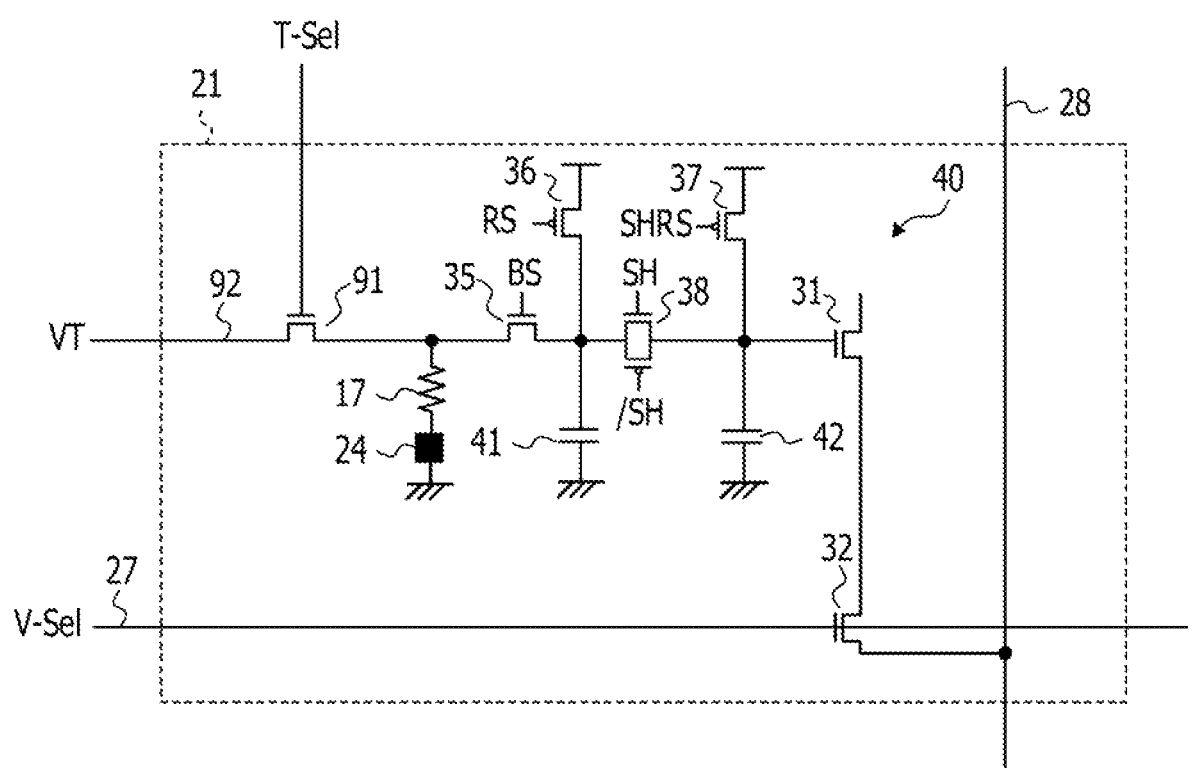
FIG. 4 is a diagram illustrating an example of a configuration of a pixel driving circuit according to the comparative example.

FIG. 4 is a diagram illustrating an example of a configuration of the pixel driving circuit 21 in the comparative example. The pixel driving circuit 21 includes a driving circuit 40 for driving the infrared detector 24. The driving circuit 40 drives the infrared detector 24 and generates, for each frame, a signal according to infrared rays incident on the infrared detector 24. The driving circuit 40 is coupled via the bump 17 to the corresponding infrared detector 24 among the plurality of infrared detectors 24 provided in the sensor array 12.

The infrared detector 24 is a photoconductive element having a characteristic in which a resistance value changes in accordance with an incident amount of infrared light. The infrared detector 24 is a light receiving element which generates a photocurrent according to the incident amount of the infrared light incident on the infrared detector 24. For example, the infrared detector 24 is a photoelectric conversion unit which converts an intensity of infrared rays into an electric signal.

The driving circuit 40 includes, for example, a driving transistor 35, a transfer gate 38, an integration capacitor 41, a holding capacitor 42, a first reset transistor 36, a second reset transistor 37, the amplification transistor 31, and the row selection transistor 32.

A source of the driving transistor 35 is coupled to one end of the infrared detector 24 via the bump 17. A bias setting signal BS supplied from a timing generator (not illustrated) outside the imaging device 14 is applied to a gate of the driving transistor 35. The other end of the infrared detector 24 is coupled to the ground (GND). The driving transistor 35 is, for example, an N-channel type metal oxide semiconductor (MOS) transistor.

The driving transistor 35 controls a period for which a current flows through the infrared detector 24 (a period for which an electric charge is discharged from the integration capacitor 41). The driving transistor 35 is set so as to open and close in accordance with the bias setting signal BS. When the driving transistor 35 is open, a current may flow from the integration capacitor 41 to the infrared detector 24.

The transfer gate 38 is an analog switch provided between the integration capacitor 41 and the holding capacitor 42. The transfer gate 38 is also referred to as a sample hold switch circuit. One end of the transfer gate 38 is coupled to the other end of the driving transistor 35 and one end of the integration capacitor 41. The other end of the integration capacitor 41 is coupled to the ground. The other end of the transfer gate 38 is coupled to one end of the holding capacitor 42.

Sample hold signals SH and /SH, which are gate driving signals, are applied to gates of the transfer gate 38. The sample hold signal /SH is an inverted signal of the sample hold signal SH. The sample hold signals SH and /SH are supplied from the timing generator mentioned above.

The integration capacitor 41 is provided between the driving transistor 35 and the transfer gate 38. For example, one end of the integration capacitor 41 is coupled to a current path coupling a drain, which is the other end, of the driving transistor 35 and the one end of the transfer gate 38. The other end of the integration capacitor 41 is coupled to the ground. A specific example of the integration capacitor 41 is an electrostatic capacitance element.

The holding capacitor 42 is coupled to the one end of the integration capacitor 41 via the transfer gate 38. The holding capacitor 42 is also referred to as a sample hold capacitor. For example, one end of the holding capacitor 42 is coupled to a current path coupled to the other end of the transfer gate 38. The other end of the holding capacitor 42 is coupled to the ground. A specific example of the holding capacitor 42 is an electrostatic capacitance element.

The first reset transistor 36 is coupled in series between the one end of the integration capacitor 41 and a power supply line. A gate of the first reset transistor 36 is driven by an integration reset signal RS supplied from the timing generator mentioned above.

The second reset transistor 37 is coupled in series between the one end of the holding capacitor 42 and a power supply line. A gate of the second reset transistor 37 is driven by a holding reset signal SHRS supplied from the timing generator mentioned above.

The amplification transistor 31 is an element which amplifies a voltage held in the holding capacitor 42 and outputs the amplified voltage. A gate of the amplification transistor 31 is coupled between the holding capacitor 42 and the second reset transistor 37.

The row selection transistor 32 is an element which outputs a voltage output from the amplification transistor 31 (a voltage corresponding to the voltage held in the holding capacitor 42) to the corresponding vertical bus 28 among the plurality of vertical buses 28 in accordance with the row selection signal V-Sel.

Next, an operation of the reading circuit 13 and the pixel driving circuit 21 is described with reference to FIGS. 3 and 4.

In the pixel driving circuit 21, the integration reset signal RS is applied to the first reset transistor 36 for gate reset to cause the first reset transistor 36 to conduct and the integration capacitor 41 is charged to a predetermined value. After the application of the integration reset signal RS is stopped, the bias setting signal BS is applied to the driving transistor 35 for gate input for a predetermined period of time to cause a current corresponding to an infrared intensity to flow through the infrared detector 24, and a voltage of the integration capacitor 41 becomes a voltage corresponding to the infrared intensity.

Next, the second reset transistor 37 for the sample hold reset conducts according to the holding reset signal SHRS, and resets a voltage level of the holding capacitor 42 to a predetermined value. Next, the sample hold signals SH and /SH are applied to the transfer gate 38, and the voltage of the integration capacitor 41 is transferred to and held in the holding capacitor 42. The sample hold signal /SH is an inverted signal of the sample hold signal SH. Since these operations are performed respectively and simultaneously by the plurality of pixel driving circuits 21, a voltage corresponding to the intensity of infrared rays incident on each of the infrared detectors 24 is held in the corresponding holding capacitor 42.

The vertical shift register 22 sequentially outputs the row selection signal V-Sel for selecting the plurality of vertical selection lines 27 one by one. According to the row selection signal V-Sel, the row selection transistor 32, of which a gate is coupled to the vertical selection line 27 to which the row selection signal V-Sel is output, conducts. A voltage held in the holding capacitor 42 of the pixel driving circuit 21 coupled to the conducting row selection transistor 32 via the amplification transistor 31 is output to the corresponding vertical bus 28 via the amplification transistor 31 and the conducting row selection transistor 32.

The horizontal shift registers 23 (23a and 23b) sequentially output the column selection signal H-Sel to the plurality of horizontal selection lines 29 coupled to gates of the plurality of column selection transistors 33 (33a and 33b).

The first horizontal shift register 23a sequentially outputs the column selection signal H-Sel to the plurality of horizontal selection lines 29 so as to sequentially read, to the first reading line 26a, voltages output from the respective pixel driving circuits for one row selected by the row selection signal V-Sel to the vertical bus 28. The voltages sequentially read to the first reading line 26a are sequentially amplified by the first output amplifier 84a, and are sequentially output from the first output amplifier 84a to a first output line 85a as an analog sensor output signal (a pixel output signal).

The second horizontal shift register 23b sequentially outputs the column selection signal H-Sel to the plurality of horizontal selection lines 29 so as to sequentially read, to the second reading line 26b, voltages output from the respective pixel driving circuits for one row selected by the row selection signal V-Sel to the vertical bus 28. The voltages sequentially read to the second reading line 26b are sequentially amplified by the second output amplifier 84b, and are sequentially output from the second output amplifier 84b to a second output line 85b as an analog sensor output signal (a pixel output signal).

When reading of the voltages is finished for all of the vertical buses 28, the vertical shift register 22 outputs the row selection signal V-Sel to the next vertical selection line 27. Thereafter, by repeating the above operation, signals according to intensities of infrared rays incident on all of the infrared detectors 24 two-dimensionally arranged are multiplexed and output to the first and second output lines 85a and 85b.

As illustrated in FIG. 4, a test wiring 92 is provided in each of the plurality of pixel driving circuits 21 for inspection. The test wiring 92 is coupled to the driving circuit 40 via a test switch 91 for inspection, and for example, is coupled to a current path between the bump 17 and the driving transistor 35. By switching on and off the test switch 91 by a test input selection pulse T-Sel supplied from the outside of the reading circuit 13, a test voltage VT may be applied from the outside of the reading circuit 13 instead of the infrared detector 24. The test input selection pulse T-Sel is an example of a test input selection signal.

For example, in the imaging device 14 illustrated in FIG. 2, the sensor array 12 is attached to the reading circuit 13 (the circuit substrate 86 on which the reading circuit 13 is formed). However, by providing the test wiring 92 and the test switch 91, the reading circuit 13 (the circuit substrate 86 on which the reading circuit 13 is formed) may be inspected alone in a process before the sensor array 12 is attached.

Figure 5:
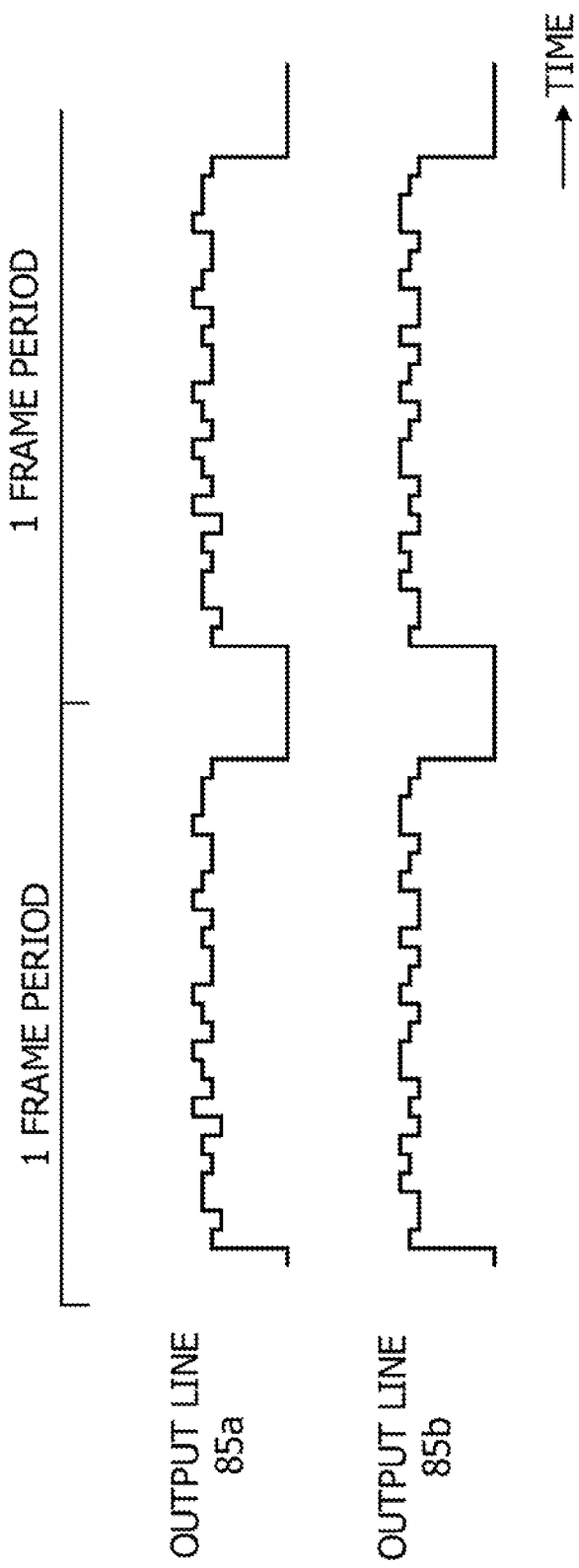
FIG. 5 is a diagram illustrating an example of output waveforms at the time of a test input according to the comparative example.

When the same test voltage VT is applied to all of the pixel driving circuits 21 in the single inspection of the reading circuit 13, analog pixel output signals which are multiplexed and output from the first and second output lines 85a and 85b have voltages approximately equal to one another (see FIG. 5). Therefore, the following phenomena (1) and (2) are not detectable.

(1) A phenomenon in which a response speed of an internal amplifier such as the output amplifier 84a or 84b is insufficient and a signal of a pixel read first is superimposed on a signal of a pixel to be read next.

(2) A crosstalk phenomenon occurring between a plurality of output lines (for example, between the first and second output lines 85a and 85b) or a crosstalk phenomenon occurring between a plurality of reading lines (for example, between the first and second reading lines 26a and 26b).

These phenomena occurring in the reading circuit 13 may cause deterioration of a modulation transfer function (MTF) of the infrared imaging apparatus or ghost display on an imaging screen.

Figure 6:
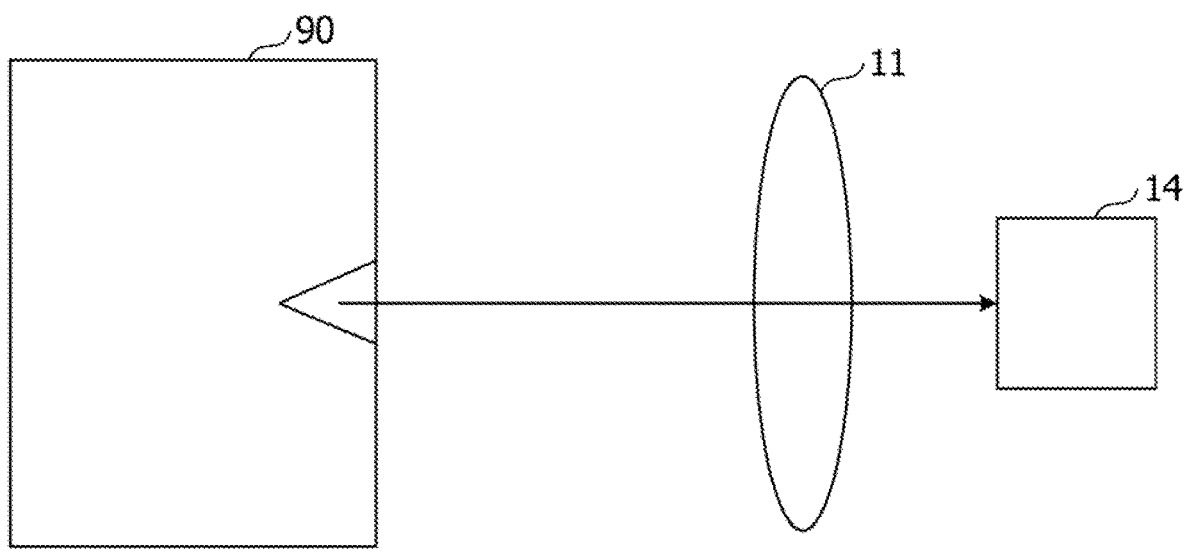
FIG. 6 is a diagram illustrating an example of an inspection method.

The MTF deterioration of the infrared imaging apparatus and the ghost may be inspected by an evaluation system using a cavity blackbody furnace 90 as illustrated in FIG. 6, for example. For example, there is a method of inspecting the MTF deterioration or the like by incorporating the imaging device 14 formed by attaching the circuit substrate 86 having a reading circuit formed thereon and the sensor array 12 to each other in the infrared imaging apparatus and by performing imaging of a point light source by the cavity blackbody furnace 90 through a lens 11.

Figure 7:
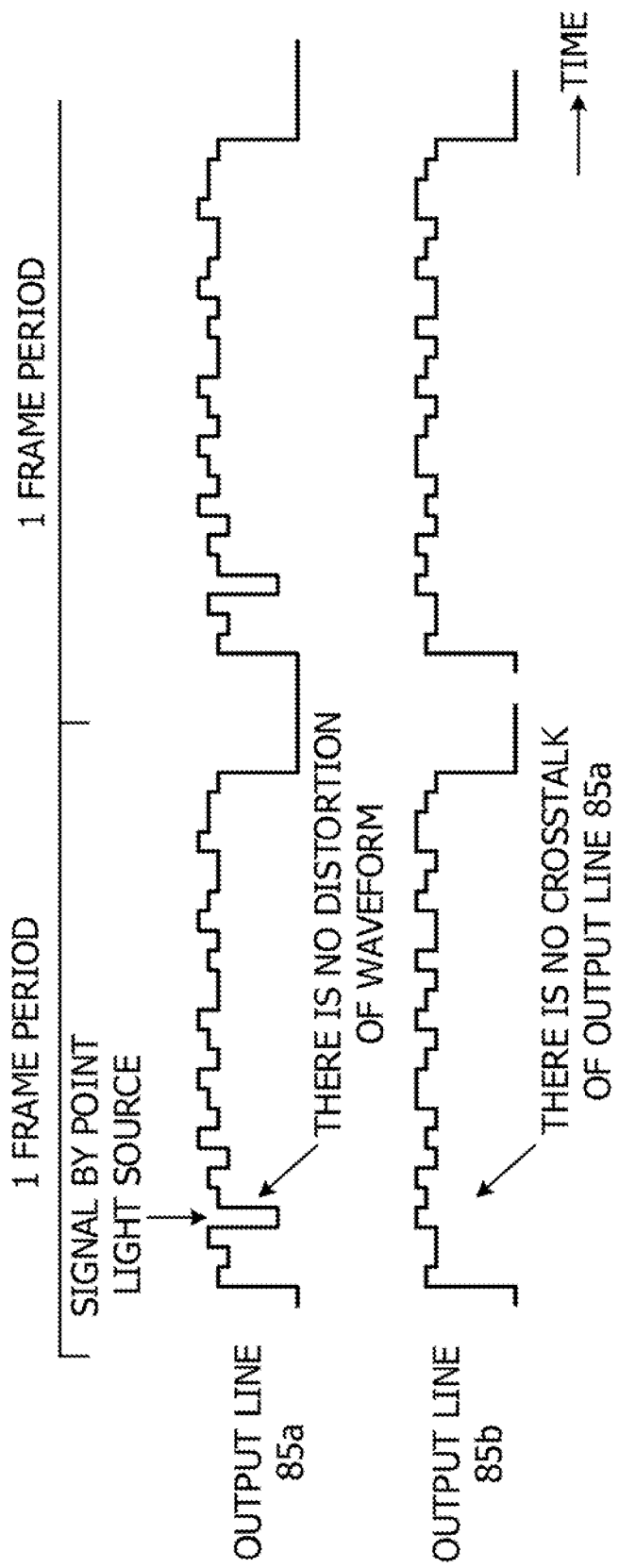
FIG. 7 is a diagram illustrating an example of output waveforms at the time of an inspection.
Figure 8:
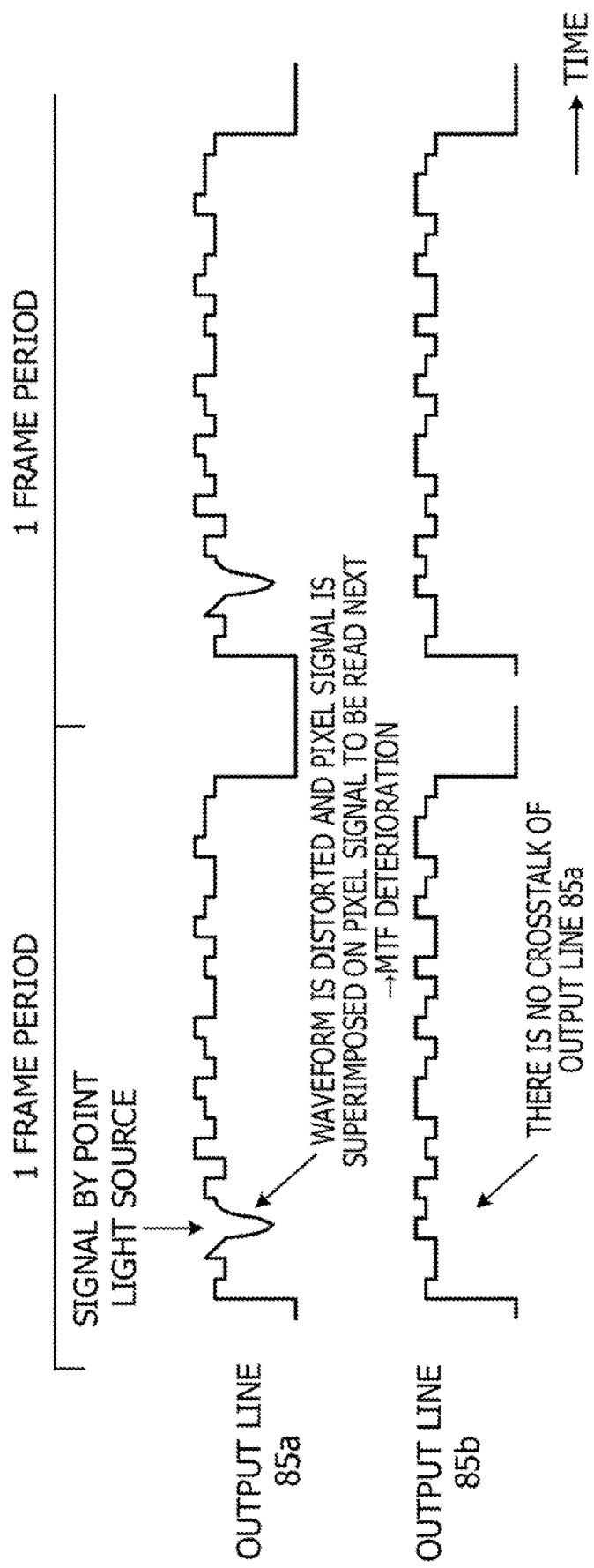
FIG. 8 is a diagram illustrating an example of output waveforms at the time of the inspection.
Figure 9:
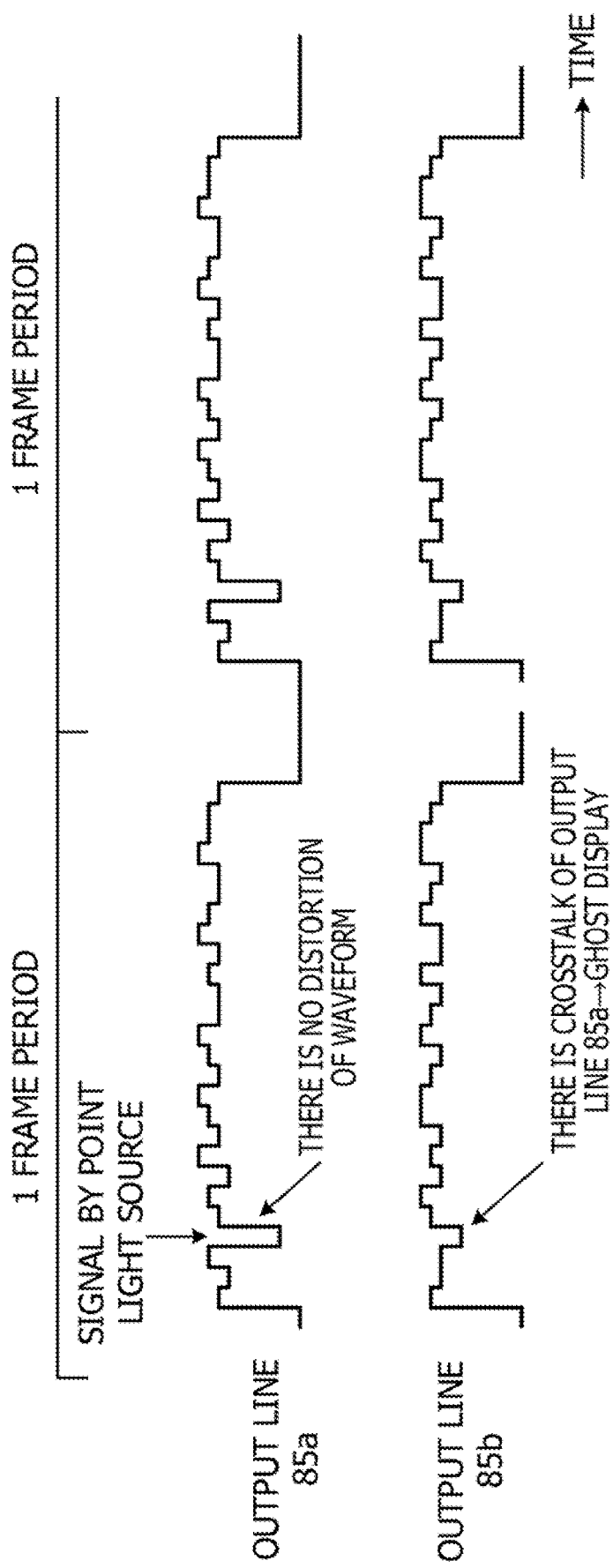
FIG. 9 is a diagram illustrating an example of output waveforms at the time of the inspection.

When the multiplexed outputs obtained by the reading circuit are as illustrated in FIG. 7, the point light source is successfully observed as a signal of one pixel. Thus, it is possible to determine that there is no problem in the response speed of the internal amplifier or the crosstalk between the output lines. When the multiplexed outputs obtained by the reading circuit are as illustrated in FIG. 8, the response speed of the internal amplifier is insufficient and a state where the signal of the pixel read first is superimposed on the signal of the pixel to be read next is observed. Thus, it is possible to determine that the MTF deterioration may occur. When the multiplexed outputs obtained by the reading circuit are as illustrated in FIG. 9, a crosstalk between the output lines is observed. Thus, it is possible to determine that ghost may be displayed on the imaging screen.

However, in the method of an inspection using the evaluation system as illustrated in FIG. 6, not only the imaging device 14 is to be completed by attaching the sensor array to the reading circuit but also an electric system and an optical system in the infrared imaging apparatus are to be adjusted. Thus, a lot of man-hours occur in the inspection process. Even when a defect of the reading circuit is found as a result of the inspection, there is a problem that the already performed attaching of the sensor array is useless and a yield of the imaging device itself is deteriorated.

In view of such a problem, the present disclosure provides a technique that enables a defect to be detected by a simple inspection of only a reading circuit without waiting for completion as the imaging device.

Figure 10:
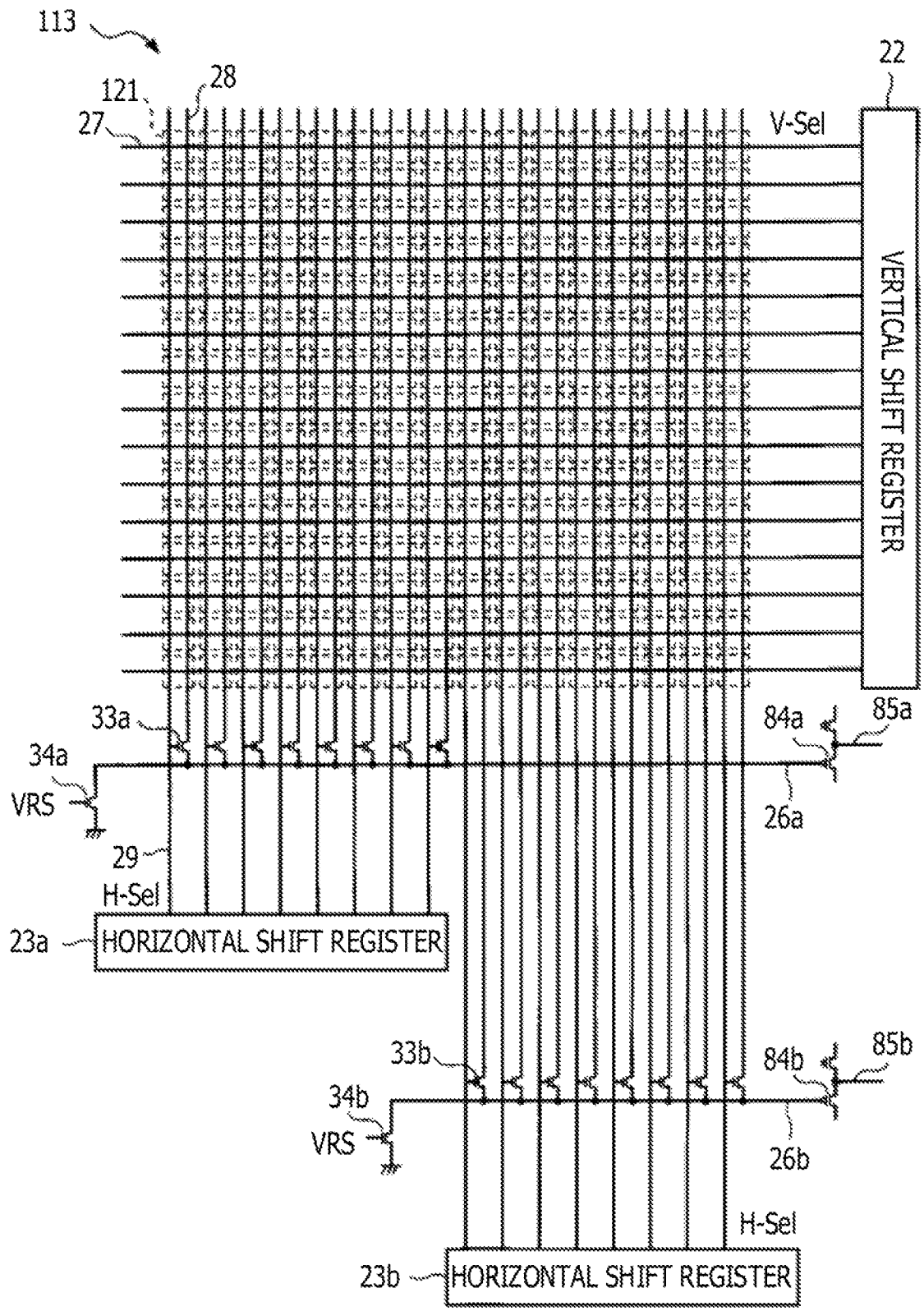
FIG. 10 is a diagram illustrating an example of a configuration of a reading circuit according to a first embodiment.

FIG. 10 is a diagram illustrating an example of a configuration of the reading circuit 113 according to a first embodiment of the present disclosure. The description of configurations that are substantially the same as those of the comparative example described above is omitted by incorporating the above description by reference. The reading circuit 113 includes a plurality of pixel driving circuits 121, the plurality of vertical buses 28, the plurality of vertical selection lines 27, the plurality of horizontal selection lines 29, the vertical shift register 22, and the horizontal shift registers 23 (23a and 23b).

Each of the plurality of pixel driving circuits 121 drives a corresponding infrared detector among a plurality of infrared detectors, and generates, for each frame, a signal according to infrared rays incident on the corresponding infrared detector. The plurality of pixel driving circuits 121 are arranged in a matrix shape to correspond to respective intersections of the plurality of vertical selection lines 27 and the plurality of vertical buses 28. Each of the plurality of pixel driving circuits 121 is provided for a corresponding one of the plurality of infrared detectors. The plurality of pixel driving circuits 121 have configurations that are identical to one another.

The plurality of horizontal selection lines 29 are scan lines provided for respective columns of the plurality of pixel driving circuits 121, and extend in parallel to a vertical direction (a column direction) with respect to each of the plurality of pixel driving circuits 121.

Figure 11:
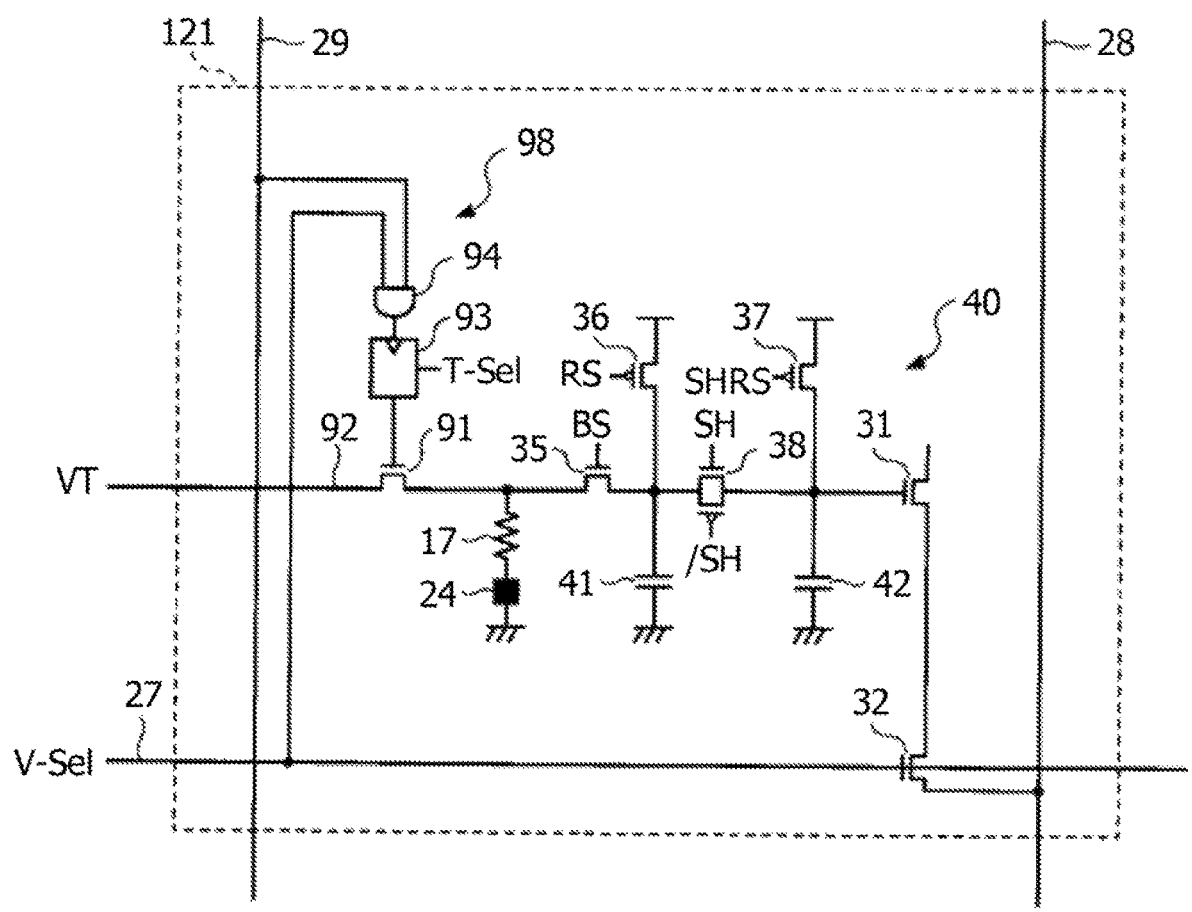
FIG. 11 is a diagram illustrating an example of a configuration of a pixel driving circuit according to the first embodiment.

FIG. 11 is a diagram illustrating an example of a configuration of the pixel driving circuit 121 provided in the reading circuit 113 according to the first embodiment. The pixel driving circuit 121 includes the driving circuit 40 of the infrared detector 24 and a switching circuit 98 which switches whether or not to input the test voltage VT supplied from the outside to the driving circuit 40. The test voltage VT is an example of a test signal.

The switching circuit 98 switches whether or not to input the test voltage VT, based on the row selection signal V-Sel output to the corresponding vertical selection line 27 among the plurality of vertical selection lines 27 and the column selection signal H-Sel output to the corresponding horizontal selection line 29 among the plurality of horizontal selection lines 29. When the test voltage VT is input, the test voltage VT is input to the driving circuit 40. When the test voltage VT is not input, the test voltage VT is not input to the driving circuit 40.

By using the row selection signal V-Sel output to the corresponding vertical selection line 27 and the column selection signal H-Sel output to the corresponding horizontal selection line 29, a given one of or a given plurality of pixel driving circuits 121 among the plurality of pixel driving circuits 121 are selectable.

For example, a setting may be made such that the test voltage VT may be input only to the driving circuit 40 of a given pixel driving circuit 121 and the test voltage VT is not input to the driving circuits 40 of the remaining pixel driving circuits 121. In a case where the horizontal shift register is divided into a plurality of horizontal shift registers as illustrated in FIG. 10, a different test input selection pulse T-Sel is provided for each of the plurality of horizontal shift registers. As a result, only one pixel is selected in one chip.

In this manner, by switching whether or not to input the test voltage VT to the driving circuit 40 based on the row selection signal V-Sel and the column selection signal H-Sel, it is possible to individually inspect a given one of or a given plurality of pixel driving circuits 121 with the input of the test voltage VT.

The switching circuit 98 includes, for example, the test switch 91 for switching whether or not to input the test voltage VT to the driving circuit 40, and a latch circuit 93 for controlling the switching operation of the test switch 91. The test switch 91 is, for example, a transistor. The latch circuit 93 controls the switching operation of the test switch 91, based on the row selection signal V-Sel output to the corresponding vertical selection line 27 among the plurality of vertical selection lines 27 and the column selection signal H-Sel output to the corresponding horizontal selection line 29 among the plurality of horizontal selection lines 29. By using the latch circuit 93, it becomes easy to select or unselect the pixel driving circuit 121 among the plurality of pixel driving circuits 121.

The switching circuit 98 includes an AND circuit 94 which generates a logical product of the row selection signal V-Sel output to the corresponding vertical selection line 27 among the plurality of vertical selection lines 27 and the column selection signal H-Sel output to the corresponding horizontal selection line 29 among the plurality of horizontal selection lines 29. The AND circuit 94 inputs the generated logical product to the latch circuit 93. By using the AND circuit 94, it becomes easy to select or unselect the pixel driving circuit 121 among the plurality of pixel driving circuits 121.

For example, the switching circuit 98 switches whether or not to input the test voltage VT to the driving circuit 40 according to the test input selection pulse T-Sel input thereto. For example, the latch circuit 93 is a D-type flip-flop which latches the input test input selection pulse T-Sel using the input logical product as a clock.

Figure 12:
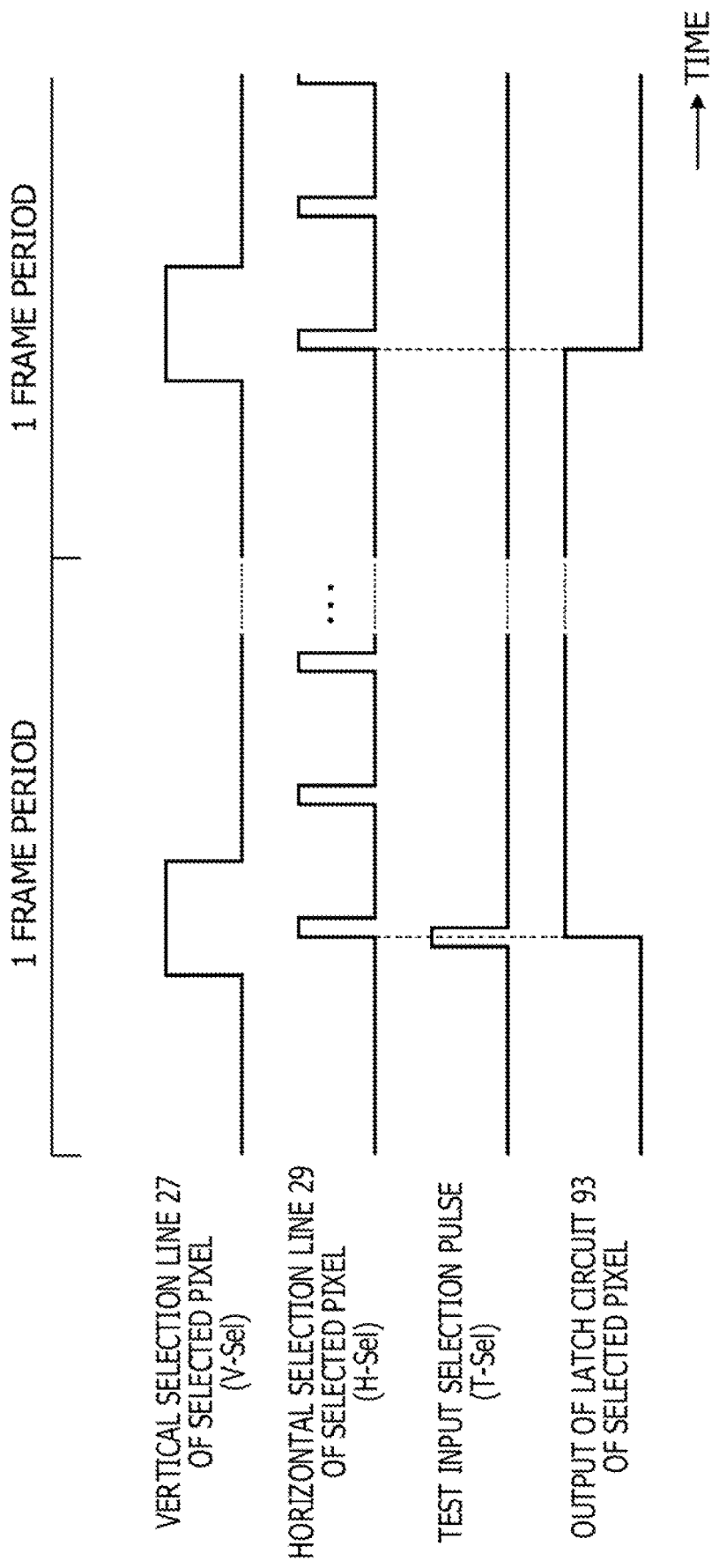
FIG. 12 is a diagram illustrating an example of a driving pulse when a test input is performed only on a specific pixel in the first embodiment.

FIG. 12 is a timing chart illustrating each waveform when the test input selection pulse T-Sel is input to only a specific one of the pixel driving circuits 121 and the test voltage VT is input to the driving circuit 40 of the specific pixel driving circuit 121. The test input selection pulse T-Sel is supplied only once in one frame. When the test input selection pulse T-Sel is not supplied to the latch circuit 93 in the next frame, the input of the test voltage VT is blocked by an off state of the test switch 91. When the test input selection pulse T-Sel is supplied to the latch circuit 93 in the same phase for each frame, the test voltage VT may be continuously input to the driving circuit 40.

Therefore, according to the configuration of the present disclosure, it is possible to perform evaluation (an inspection) using only the reading circuit 113 without examining MTF deterioration or existence of ghost with the evaluation system illustrated in FIG. 6 (without using the optical system).

Figure 13:
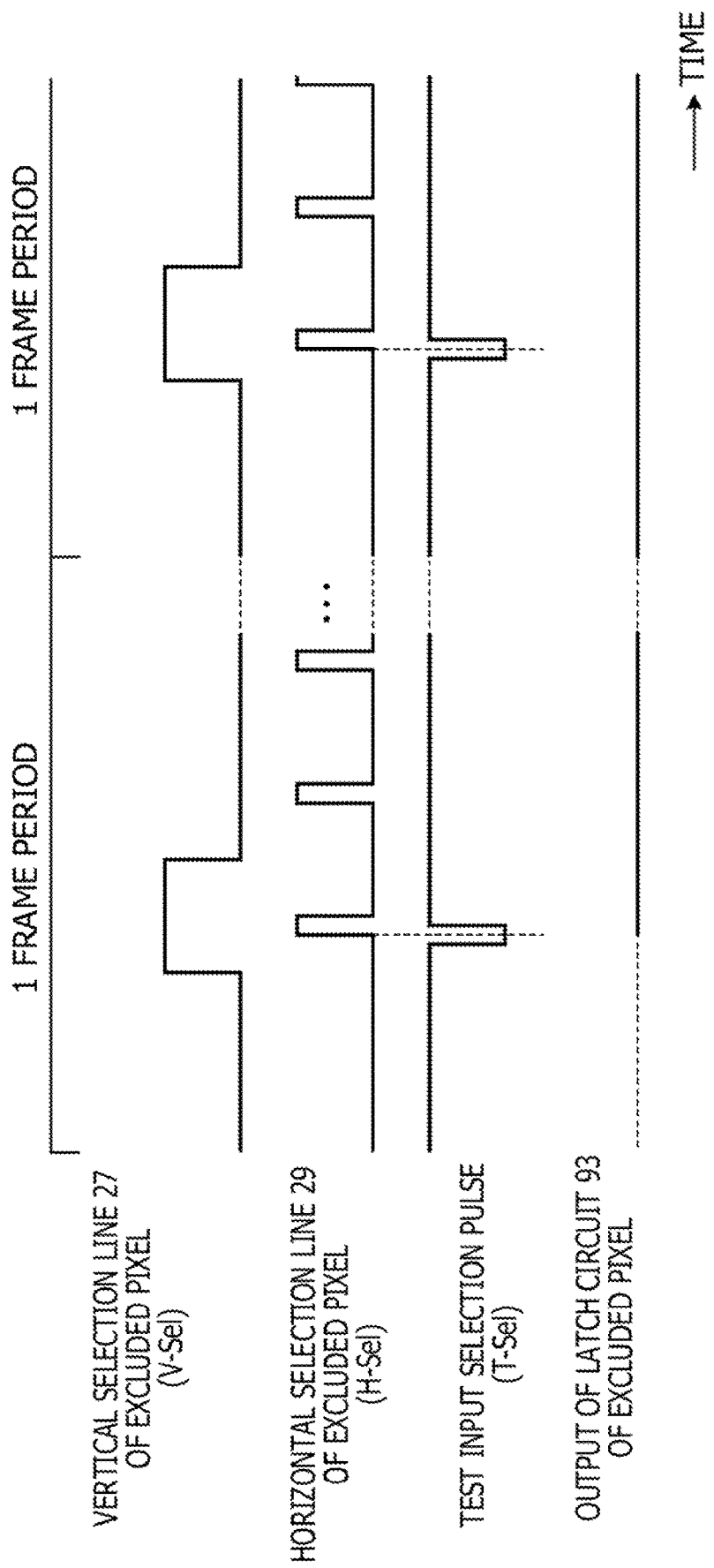
FIG. 13 is a diagram illustrating an example of a driving pulse when a test input is performed on all remaining pixels except for the specific pixel in the first embodiment.

FIG. 13 is a diagram illustrating a setting in which there is no input of the test input selection pulse T-Sel to only the given one of the pixel driving circuits and the test input selection pulse T-Sel is input to the other pixel driving circuits including pixel driving circuits adjacent to the given one of the pixel driving circuits, contrary to FIG. 12.

Figure 14:
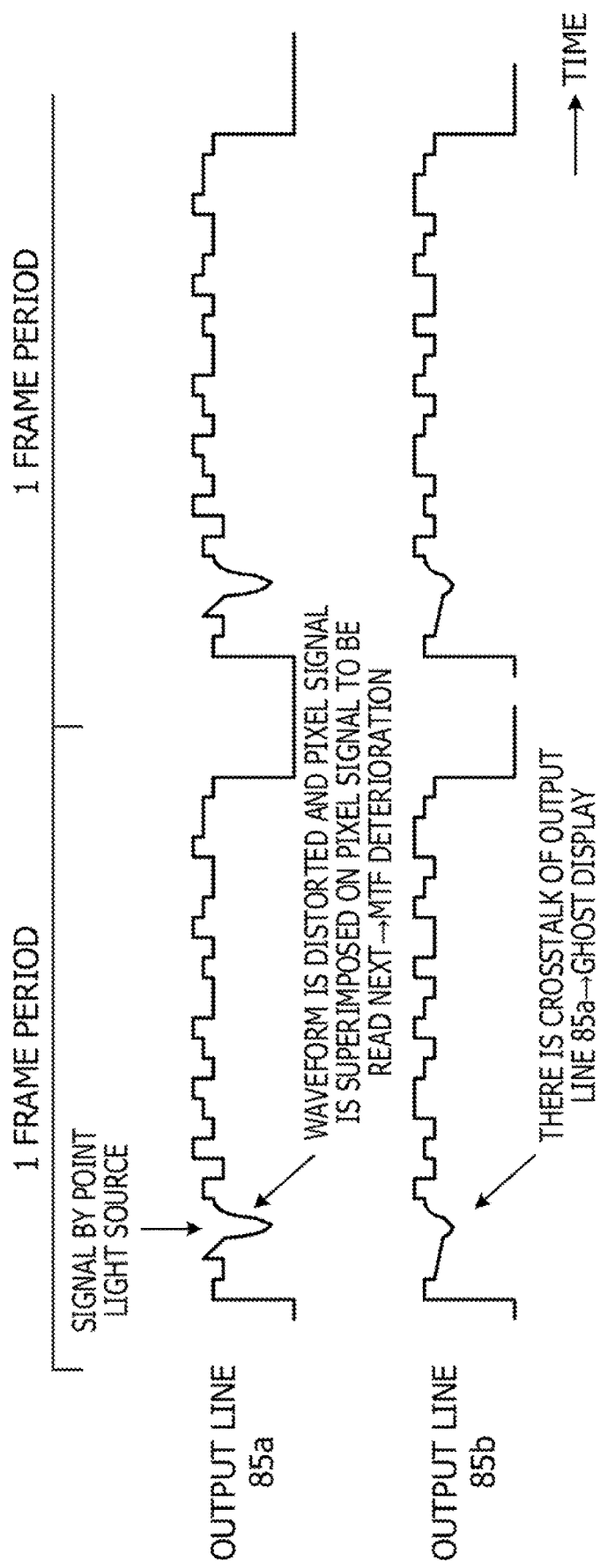
FIG. 14 is a diagram illustrating an example of output waveforms when a test input is performed only on the specific pixel in the first embodiment.
Figure 15:
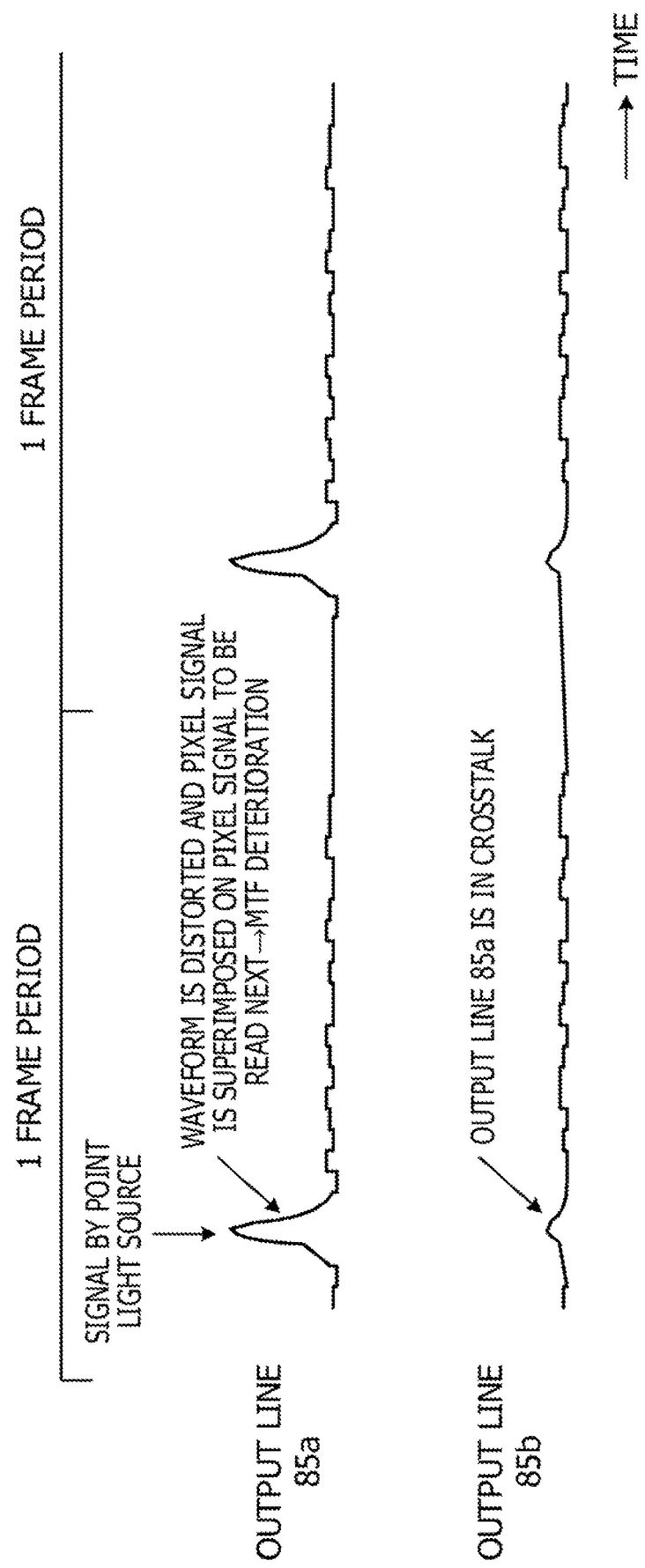
FIG. 15 is a diagram illustrating an example of output waveforms when a test input is performed on all the remaining pixels except for the specific pixel in the first embodiment.

FIG. 14 is a diagram illustrating an example of waveforms output from the first and second output lines 85a and 85b with the setting illustrated in FIG. 12. FIG. 15 is a diagram illustrating an example of waveforms output from the first and second output lines 85a and 85b with the setting illustrated in FIG. 13. When FIG. 14 is compared with FIG. 15, the rising and falling edges of the output waveforms is easier to understand with the setting in which there is no test input selection pulse T-Sel to only one pixel and the test input selection pulse T-Sel is input to the other pixels (the setting in FIG. 13) than with the setting in FIG. 12. Thus, an effect of reducing erroneous detection of the waveforms is high.

Figure 16:
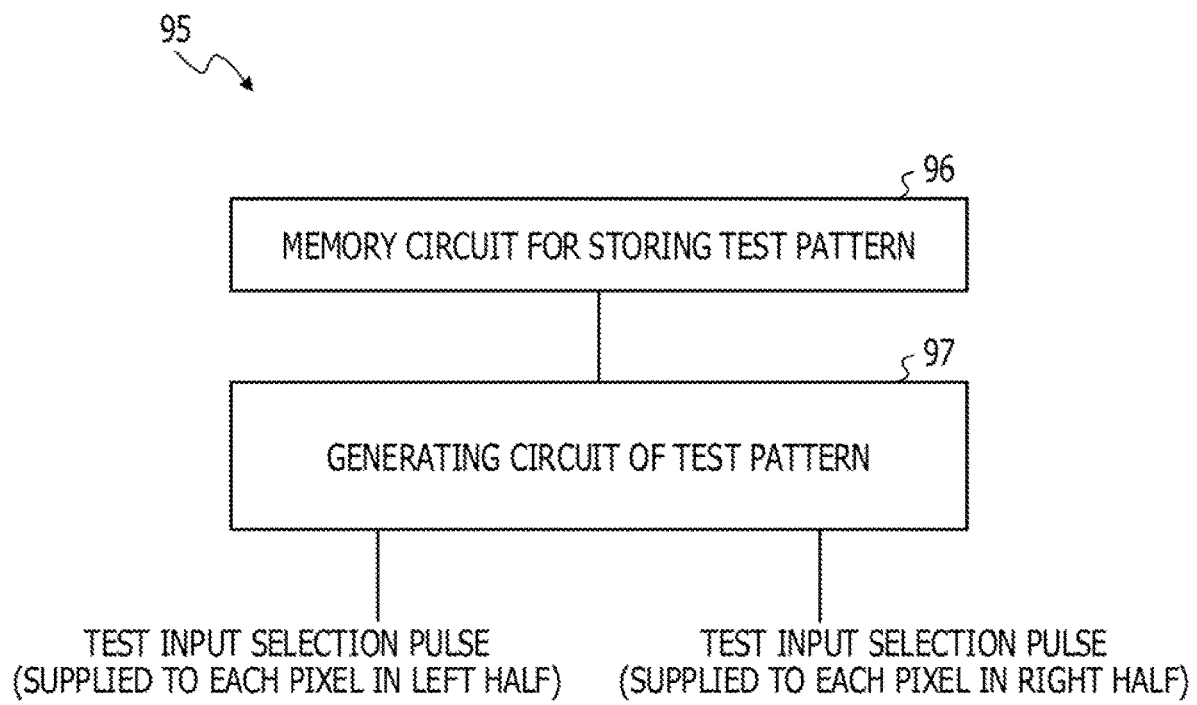
FIG. 16 is a diagram illustrating an example of a configuration of a generation circuit of a test input selection pulse.

FIG. 16 illustrates an example of a configuration of a generation circuit 95 which generates the test input selection pulse T-Sel. The reading circuit 113 may include the generation circuit 95 which generates the test input selection pulse T-Sel within the chip (for example, the generation circuit 95 may also be formed on the circuit substrate 86 on which the reading circuit 113 is formed). Alternatively, the generation circuit 95 may be provided outside the reading circuit 113 (for example, in an inspection apparatus which inspects the reading circuit 113).

Since the reading circuit 113 includes the generation circuit 95, there is no longer supplying the test input selection pulse T-Sel from the inspection apparatus which inspects the reading circuit 113 to each of the pixel driving circuits 121. For example, since an input electrode for inputting the test input selection pulse T-Sel from the outside is no longer provided on the circuit substrate 86, reduction in size of the circuit substrate 86 and consequently reduction in size of the imaging device 14 may be achieved.

For example, the switching circuit 98 switches whether or not to input the test voltage VT to the driving circuit 40, based on a test pattern stored in a memory circuit 96. By using the test pattern stored in advance, efficiency of the inspection of the reading circuit 113 is improved.

The generation circuit 95 includes, for example, the memory circuit 96 which stores a test pattern defining on and off timings or the like of the test switch 91, and a generating circuit 97 which generates the test input selection pulse T-SEL based on the test pattern stored in the memory circuit 96.

Output timing information of the row selection signal V-Sel, the column selection signal H-Sel, the test input selection pulse T-Sel, and so on is defined in the test pattern. Output timing information of signals for operating the driving circuit 40, such as for example the bias setting signal BS and the integration reset signal RS, is defined in the test pattern.

The generating circuit 97 generates two types of the test input selection pulses T-Sel. The first test input selection pulse T-Sel is supplied to each of the plurality of pixel driving circuits 121 of which a signal is read by the first horizontal shift register 23*a*. The second test input selection pulse T-Sel is supplied to each of the plurality of pixel driving circuits 121 of which a signal is read by the second horizontal shift register 23*b*.

Figure 17:
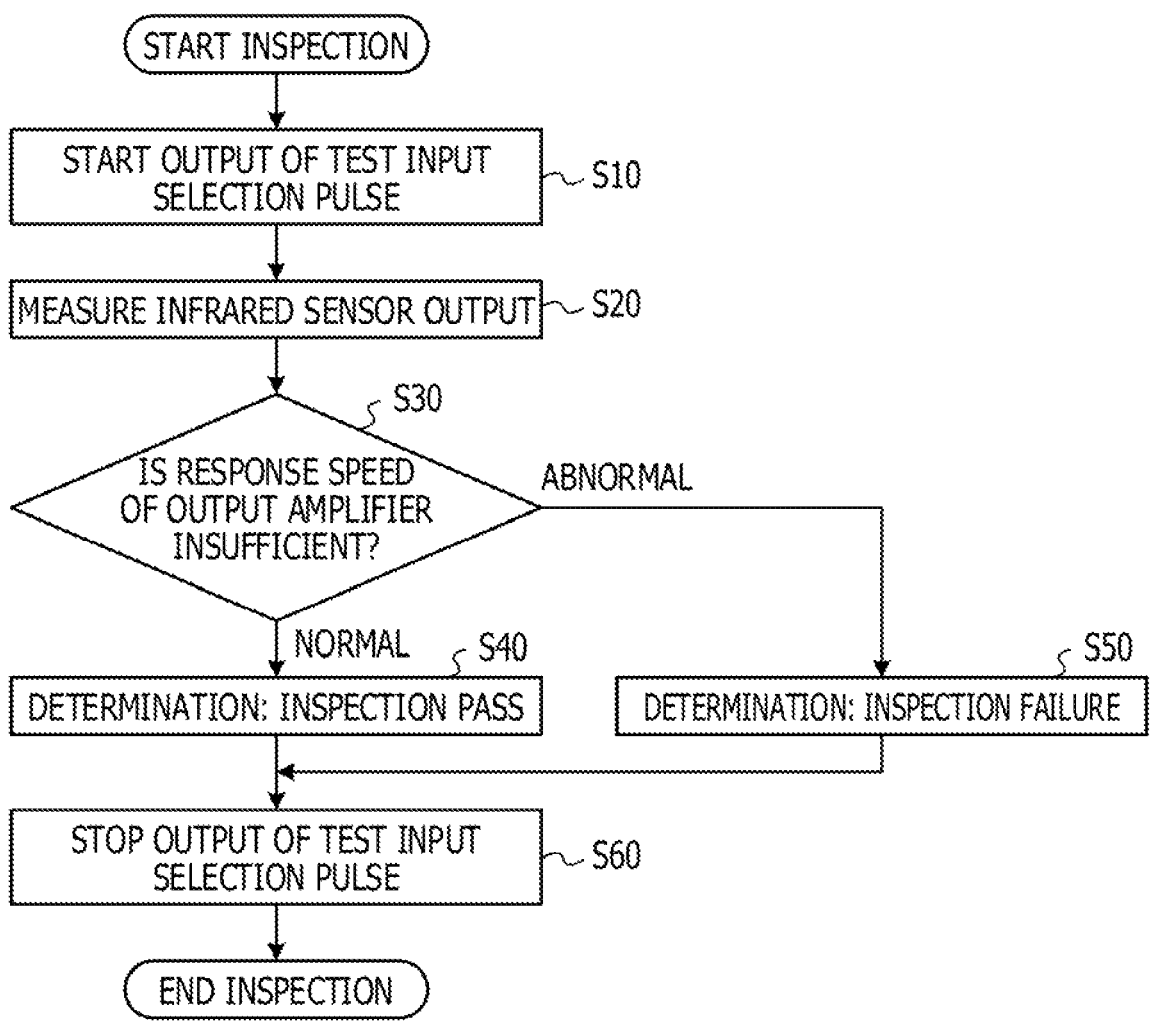
FIG. 17 is a flowchart illustrating an example of an inspection method.
Figure 18:
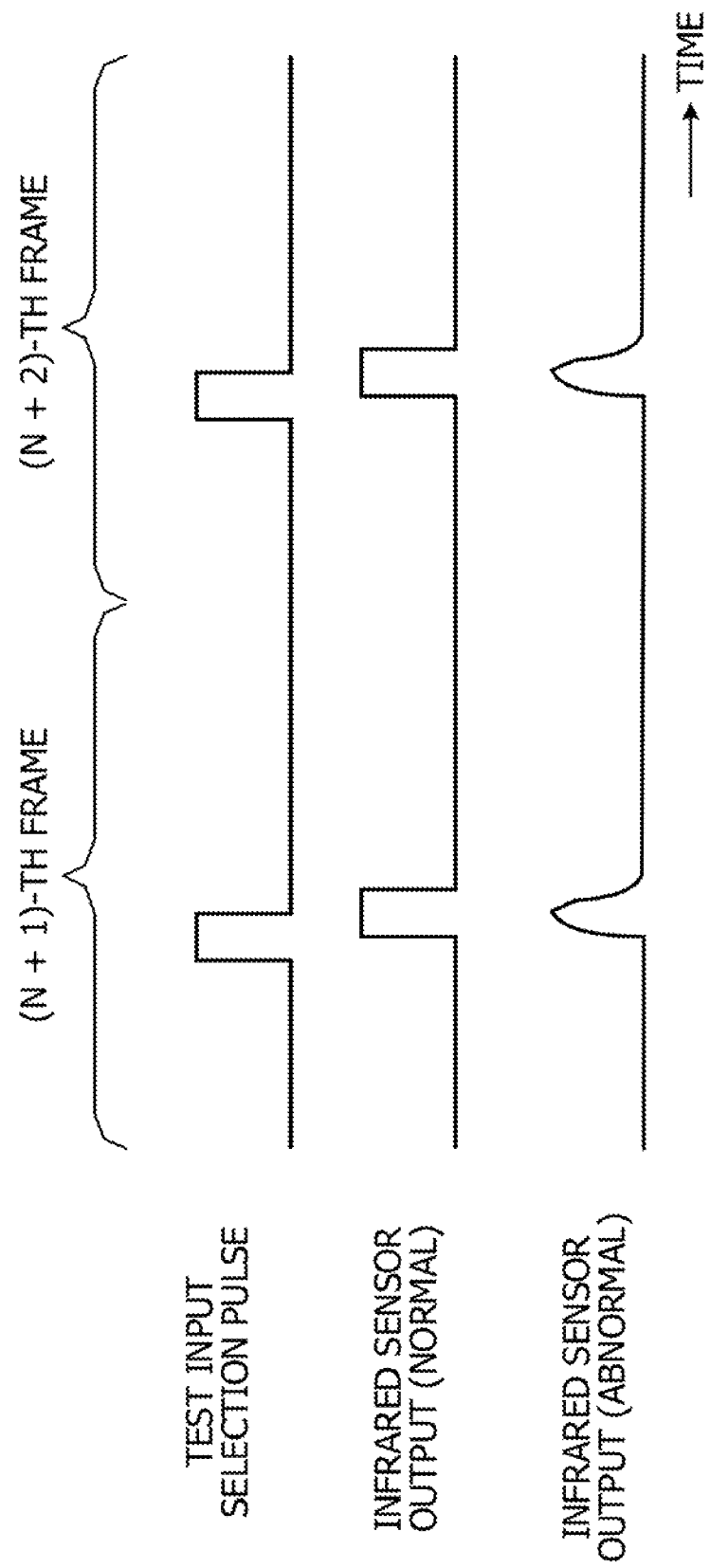
FIG. 18 is a diagram illustrating an example of output waveforms at the time of an inspection of an output amplifier.

FIG. 17 is a flowchart illustrating an example of an inspection method performed by the inspection apparatus for inspecting the reading circuit, and illustrates an example of a method of inspecting a response speed of an internal amplifier such as the output amplifier 84*a* or 84*b*. FIG. 18 is a diagram illustrating an example of output waveforms when the response speed of the internal amplifier such as the output amplifier 84*a* or 84*b* is inspected with the method illustrated in FIG. 17. In FIG. 18, the "infrared sensor output" indicates an output waveform of the first output line 85*a* or the second output line 85*b*.

At a timing when a signal is read from the pixel driving circuit 121 by the row selection signal V-Sel and the column selection signal H-Sel, the test voltage VT is input to the driving circuit 40 of the pixel driving circuit 21 for which the test input selection pulse T-Sel is active (in this case, a high level). An output level of the driving circuit 40 to which the test voltage VT is input is different from output levels of the driving circuit 40 of the other pixel driving circuits 121 to which the test voltage VT is not input. Therefore, the inspection apparatus may accurately inspect the response speed of the internal amplifier such as the output amplifier 84 by monitoring a voltage of a signal output to the output line 85.

Next, each step in FIG. 17 is described.

In step S10, the inspection apparatus selects the pixel driving circuit 121 to which the test input selection pulse T-Sel is to be input among the plurality of pixel driving circuits 121 based on a test pattern, and starts an output of the test input selection pulse T-Sel.

In step S20, the inspection apparatus measures a signal that is read from the pixel driving circuit 121 to which the test input selection pulse T-Sel is input and that is output from the output amplifier 84 or the like.

In step S30, the inspection apparatus measures a voltage of the signal that is read to the reading line 26 and is output to the output line 85, and compares the measured voltage value with an expected value. The inspection apparatus compares the measured voltage value with the expected value to determine whether or not a response speed of the output amplifier 84 is insufficient, and outputs the comparison result (a result of the determination) on a monitor or the like.

When a difference between the measured voltage value and the expected value is less than a predetermined threshold value, the inspection apparatus determines that the response speed of the output amplifier 84 is not insufficient and the reading circuit 113 is passed (step S40). On the other hand, when the difference between the measured voltage value and the expected value is equal to or larger than the predetermined threshold value, the inspection apparatus determines that the response speed of the output amplifier 84 is insufficient and the reading circuit 113 is failed (step S50).

After it is determined whether or not the reading circuit 113 is passed, the inspection apparatus stops the output of the test input selection pulse T-Sel (step S60).

Therefore, according to the reading circuit of the present embodiment, it is possible to set a state in which a test signal is input to only the driving circuit 40 of a given pixel driving circuit and the test signal is not input to the driving circuits 40 of the other pixel driving circuits at the time of the inspection. By causing the reading circuit 113 to operate in this state and observing an output waveform of the reading circuit 113, the inspection apparatus may inspect whether or not the MTF is deteriorated due to an output of one pixel driving circuit being superimposed on an output of another pixel driving circuit.

Since the inspection may be performed by using only the reading circuit, adjustment of the optical system or the like is not required and a time required for the inspection is reduced. Since completion of the imaging device is not required and the inspection may be performed before the infrared detector is coupled (attached), reduction in an inspection cost and shortening of the inspection time may be realized. Since the reading circuit may be inspected in advance before the infrared detector is coupled (attached), the imaging device may be manufactured by using only the reading circuit with good quality and a yield may be expected to be improved.

Although the reading circuit for the infrared detectors and the method for inspecting the same are described with the above embodiment, the present disclosure is not limited to the above embodiment. Various modifications and improvements, such as combinations and substitutions with some or all of the other embodiments, are possible within the scope of the present disclosure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A reading circuit for an infrared detector, comprising:
   a plurality of pixel driving circuits arranged in a matrix shape;
   a plurality of vertical selection lines provided for respective rows of the plurality of pixel driving circuits;

a plurality of horizontal selection lines provided for respective columns of the plurality of pixel driving circuits;

a vertical selection circuit configured to sequentially output a row selection signal to the plurality of vertical selection lines; and a horizontal selection circuit configured to sequentially output a column selection signal to the plurality of horizontal selection lines to sequentially read, to a reading line, a signal from pixel driving circuits for one row which are selected by the row selection signal among the plurality of pixel driving circuits, wherein each of the plurality of pixel driving circuits includes a driving circuit of the infrared detector, and a switching circuit configured to switch whether or not to input a test signal supplied from outside to the driving circuit, based on the row selection signal output to a corresponding vertical selection line among the plurality of vertical selection lines and the column selection signal output to a corresponding horizontal selection line among the plurality of horizontal selection lines, the switching circuit includes a switch configured to switch whether or not to input the test signal to the driving circuit, and a latch circuit configured to control a switching operation of the switch, based on the row selection signal output to the corresponding vertical selection line among the plurality of vertical selection lines and the column selection signal output to the corresponding horizontal selection line among the plurality of horizontal selection lines, the switching circuit further includes an AND circuit configured to input, to the latch circuit, a logical product of the row selection signal output to the corresponding vertical selection line among the plurality of vertical selection lines and the column selection signal output to the corresponding horizontal selection line among the plurality of horizontal selection lines.

2. The reading circuit for infrared detectors according to claim 1, wherein the latch circuit latches a test input selection pulse input by using as a clock the logical product input.

3. The reading circuit for infrared detectors according to claim 2, further comprising: a generation circuit configured to generate the test input selection pulse.

4. The reading circuit for infrared detectors according to claim 3, wherein the generation circuit includes a memory circuit configured to store a test pattern, and a generating circuit configured to generate the test input selection pulse based on the test pattern stored in the memory circuit.

5. The reading circuit for infrared detectors according to claim 1, further comprising:
a memory circuit configured to store a test pattern, wherein the switching circuit switches whether or not to input the test signal to the driving circuit, based on the test pattern stored in the memory circuit.

6. The reading circuit for infrared detectors according to claim 1, wherein the switching circuit switches whether or not to input the test signal to the driving circuit according to a test input selection pulse input thereto.

7. A method of inspecting a reading circuit for an infrared detector, comprising:
sequentially outputting, by a horizontal selection circuit provided in the reading circuit including a plurality of pixel driving circuits arranged in a matrix shape, a plurality of vertical selection lines provided for respective rows of the plurality of pixel driving circuits, a plurality of horizontal selection lines provided for respective columns of the plurality of pixel driving circuits, and a vertical selection circuit configured to sequentially output a row selection signal to the plurality of vertical selection lines a column selection signal to the plurality of horizontal selection lines to sequentially read, to a reading line, a signal from pixel driving circuits for one row which are selected by the row selection signal among the plurality of pixel driving circuits;

switching, by a switching circuit provided in each of the plurality of pixel driving circuits including a driving circuit of the infrared detector, whether to input a test signal supplied from outside to the driving circuit, based on the row selection signal output to a corresponding vertical selection line among the plurality of vertical selection lines and the column selection signal output to a corresponding horizontal selection line among the plurality of horizontal selection lines; and supplying the test signal to each of the plurality of pixel driving circuits, the switching circuit includes a switch configured to switch whether or not to input the test signal to the driving circuit, and a latch circuit configured to control a switching operation of the switch, based on the row selection signal output to the corresponding vertical selection line among the plurality of vertical selection lines and the column selection signal output to the corresponding horizontal selection line among the plurality of horizontal selection lines, the switching circuit further includes an AND circuit configured to input, to the latch circuit, a logical product of the row selection signal output to the corresponding vertical selection line among the plurality of vertical selection lines and the column selection signal output to the corresponding horizontal selection line among the plurality of horizontal selection lines.

8. The method according to claim 7, wherein the latch circuit latches a test input selection pulse input by using as a clock the logical product input.

9. The method according to claim 8, wherein the reading circuit further includes a generation circuit configured to generate the test input selection pulse.

10. The method according to claim 9, wherein the generation circuit includes a memory circuit configured to store a test pattern, and a generating circuit configured to generate the test input selection pulse based on the test pattern stored in the memory circuit.

11. The method according to claim 7, wherein the reading circuit further includes a memory circuit configured to store a test pattern, the switching circuit switches whether or not to input the test signal to the driving circuit based on the test pattern stored in the memory circuit.

12. The method according to claim 7, wherein the switching circuit switches whether or not to input the test signal to the driving circuit according to a test input selection pulse input thereto.

13. The method according to claim 7, further comprising:
measuring a signal which is read to the reading line and is output from the reading line; and outputting a result of comparison between a measured value of the signal and an expected value.

14. The method according to claim 7, wherein the method is carried out before the reading circuit is coupled to the infrared detectors.

* * * * *